United States Patent [19]

Bischof et al.

[11] Patent Number: 5,431,052
[45] Date of Patent: Jul. 11, 1995

[54] CAPACITIVE SENSOR

[75] Inventors: Richard Bischof, Marin; Guenther Findler, Stuttgart, both of Germany

[73] Assignee: Robert Bosch GmbH, Stuttgart, Germany

[21] Appl. No.: 6,046

[22] Filed: Jan. 19, 1993

[30] Foreign Application Priority Data

Jan. 22, 1992 [DE] Germany ............... 42 01 578.2

[51] Int. Cl.⁶ ............................................. H01L 21/00
[52] U.S. Cl. ................................. 73/517 R; 437/180
[58] Field of Search ......... 73/517 R, 517 A, 517 AV; 437/61, 180, 186, 189, 190, 193, 195, 915, 980

[56] References Cited

U.S. PATENT DOCUMENTS

| | | | |
|---|---|---|---|
| 4,882,933 | 11/1989 | Petersen et al. | 73/517 R |
| 4,930,042 | 5/1990 | Wiegand et al. | 73/517 A V |
| 5,000,817 | 3/1991 | Aine | 73/517 R |
| 5,008,774 | 4/1991 | Bullis et al. | 73/517 R |
| 5,095,752 | 3/1992 | Suzuki et al. | 73/517 |
| 5,228,341 | 7/1993 | Tsuchitani et al. | 73/517 R |

OTHER PUBLICATIONS

Koide et al./Hitachi, Ltd., "A Multi-Step Anisotropic Etching Process for Producing 3-D Silicon Accelerometers", Technical Digest of the 11th Sensor Symposium, Arcadia Ichigaya (Shigaku Kaikan), Tokyo, Jun. 4-5, 1992, The Institute of Electrical Engineers of Japan, pp. 23-26.

*Primary Examiner*—Hezron E. Williams
*Assistant Examiner*—Helen C. Kwok
*Attorney, Agent, or Firm*—Frishauf, Holtz, Goodman & Woodward

[57] ABSTRACT

A capacitive sensor has a plurality of mutually insulated metallized silicon wafers or plates, the bond bases of which were treated by etching to create trapezoidally-cross-sectional bonding bases or pads for wire-bonding of the individual silicon plates. The stray capacitance caused by the bond bases is reduced by this step and the value of the stray capacitance becomes exactly reproducible.

13 Claims, 3 Drawing Sheets

CAPACITIVE SENSOR

CROSS-REFERENCE TO RELATED LITERATURE

Koide et al./Hitachi, Ltd., "A Multi-Step Anisotropic Etching Process for Producing 3-D Silicon Accelerometers", Technical Digest of the 11th Sensor Symposium, Arcadia Ichigaya (Shigaku Kaikan), Tokyo, Jun. 4-5, 1992, The Institute of Electrical Engineers of Japan EP-A1 369 352, SUZUKI et al. and corresp. U.S. Pat. No. 5,095,752 to Suzuki et al.

FIELD OF THE INVENTION

The invention relates to a capacitive sensor, and more particularly to wire bond bases thereon, to which bonding wires can be connected.

BACKGROUND

Capacitive sensors which are connected by bonding of bonding wires on the silicon plates are described in U.S. Pat. No. 5,095,752, Suzuki et al. The surfaces intended for bond pads, are formed by recesses in the silicon plates located above them. Methods for creating bond pads on the upper silicon plate by the application of electrically conductive pastes to the front face of a silicon plate sandwich are also disclosed.

THE INVENTION

It is an object to provide a capacitive sensor with low stray capacitance or, where the stray capacitance of the sensor can be carefully controlled so that it can be taken into account when signals from the sensor are being evaluated.

Briefly, the capacitive sensor is formed of a plurality of superimposed silicon plates placed on top of each other, and insulated from each other. One of the plates has a movable electrode structured thereunder to form, together with at least one other silicon plate, a plate capacitor. Bonding wires are connected to the respective plates. In accordance with the present invention, the bonding wires are connected to wire bonding bases which are formed on portions of the respective silicon plates for connecting the bonding wire, the wire bonding bases being etched out from the respective silicon plate and, preferably, forming a projecting base of trapezoidal or hexagonal cross section. A contact surface between the wire bonding base and the silicon plates therebeneath is formed by an etched region of either the wire bonding base or one of the silicon plates thereunder.

The capacitive sensor of the invention has the advantage that the wire bond bases, or bond bases, for short, are exactly defined. The value of the stray capacitance caused by the bond bases is exactly controlled by treating the bond bases by etching. For one, this results in a reduced value of the stray capacitance and, in addition, the value of the stray capacitance is exactly reproducible and can therefore be taken into account when evaluating the sensor. The use of etching processes permits the use of the processes for making the sensors also for making the bond bases. It is therefore possible to treat the bond bases without having to incorporate further treatment steps into the manufacturing process.

In a particularly advantageous embodiment the contact surface between the bond base and the silicon plate located thereunder is smaller than the surface for applying the bonding wire. The stray capacitance of the sensor is reduced in this way without greater demands being made on the adjusting accuracy of the bonding process. The bond base is produced particularly simply with a trapezoidal cross section, because a cross section of this type can be achieved particularly simply by etching from only one side of the silicon plate. Such a trapezoidal bond base should be connected by the shorter of the parallel sides of the trapezoid with a silicon plate located thereunder for reducing the stray capacitance of the sensor. When employing two-sided etching processes, it is possible in a particularly simple manner to create bond bases with a hexagonal cross section. A simple method for reducing the contact surface between the bond base and the silicon plate located thereunder consists in etching of the silicon plate located underneath the bond base. With sufficient stability of the bond bases it is even possible to reduce the stray capacitance generated by the bond base to near zero in that the silicon plate located underneath the bond base has a recess. These bond bases are used particularly advantageously in connection with capacitive sensors consisting of three silicon plates. It is possible in this case to form the center plate as a support to increase the stability of the bond base of the top plate. In these sensors the bond base of the center plate is formed particularly simply with a nearly trapezoidal cross section with half the thickness of the center plate. In this manner it is possible to use the etching processes, which as a rule take place on two sides, for manufacturing the movable electrode particularly effectively for producing the bond base.

DRAWINGS

DETAILED DESCRIPTION

Figure 1:
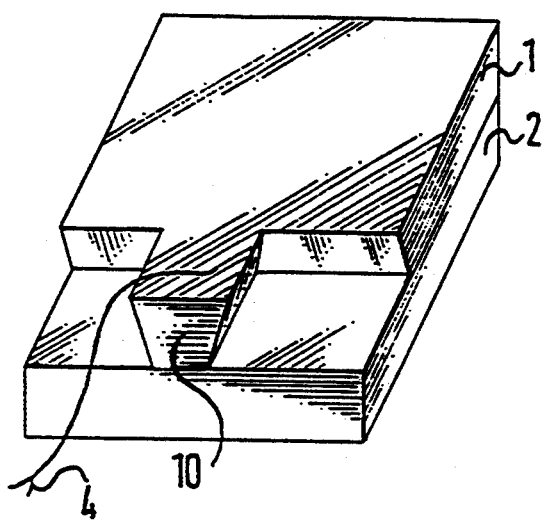
FIG. 1 illustrates a bond base of trapezoidal cross section.
Figure 5:
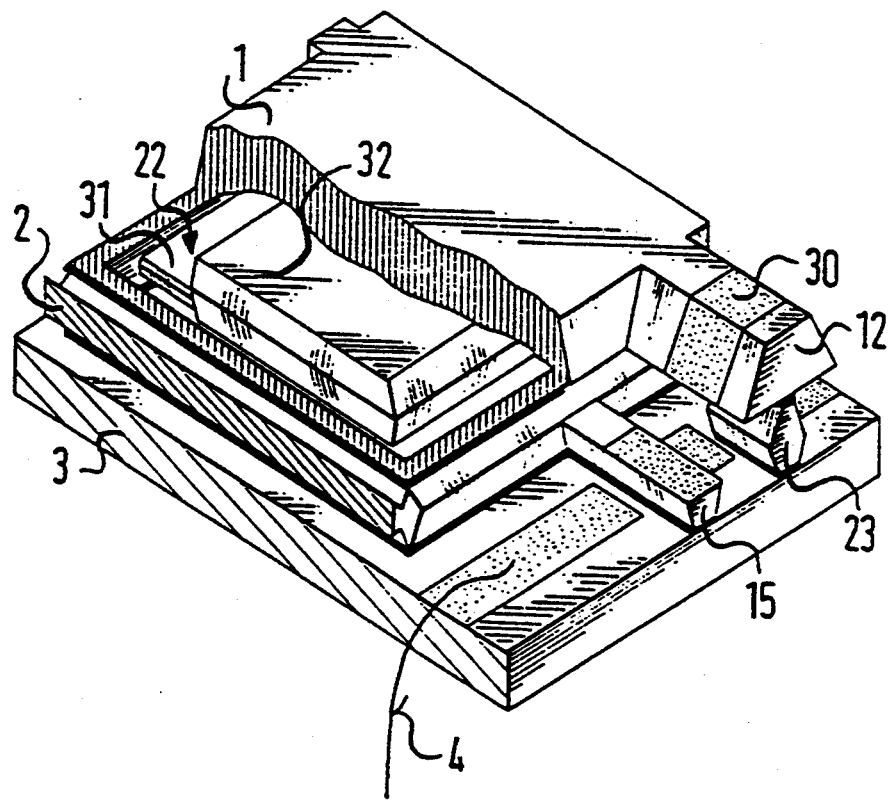
FIG. 5 illustrates a capacitive sensor of three silicon plates with the bond base of the invention and FIGS. 6a, b and c illustrate various embodiments of the nearly trapezoidal bond base.

FIG. 1 illustrates two silicon plates 1, 2, placed on top of each other, where the silicon plate 1 has a bond base 10, on which a bonding wire 4 is fastened. The two silicon plates 1 and 2 are rigidly connected with each other. As a rule, this rigid connection is provided by means of a silicon bonding process. For this, the silicon plates 1, 2 are provided with a thin oxide film by chemical pre-treatment or thermal oxidation. A connection between the two silicon plates 1, 2, which cannot be dissolved, is created by placing them on top of each other and by subsequent heat treatment. However, other connection techniques, such as gluing, anodic bonding, soldering or the use of auxiliary layers such as glass are also conceivable. The silicon plate 1 is electrically connected by the bonding wire 4. The capacitance between the silicon plate 1 and the silicon plate 2 can be measured via the bonding wire 4 and other connections for the silicon plate 2, not shown here. Capacitive sensors have movable electrodes by means of which the capacitance between the silicon plates is a measure of, for example, acceleration, inclination or rate of turning. The actual embodiment of such a sensor is not the subject of the invention here, an appropriate example is illustrated in FIG. 5. A stray capacitance is connected parallel to the variable capacitance of the sensor, the value of which is substantially determined by the contact surface between the silicon plate 1 and the silicon plate 2.

In accordance with a feature of the invention, the stray capacitance caused by the bond bases is reduced or reproducibly defined by bond bases 10–15.

FIG. 1 illustrates a bond base 10, projection from the plate 1, having a trapezoidal cross section, transverse to the direction of its projection from plate 1. The top and bottom of this trapezoid are parallel to each other, the inclined side walls are at an angle of approximately 70.5° to each other. Bond bases with such cross sections can be produced by anisotropic etching with a base etching solution in 100-oriented silicon. The etching process necessary for this takes place from only one side of the silicon plate 1, in this case from the side facing the silicon plate 2. The etching processes required for this are known to one skilled in the art. The front sides of the silicon plates 1 and 2 or of the bond base 10 shown here were produced by sawing a larger silicon wafer sandwich.

Figure 2:
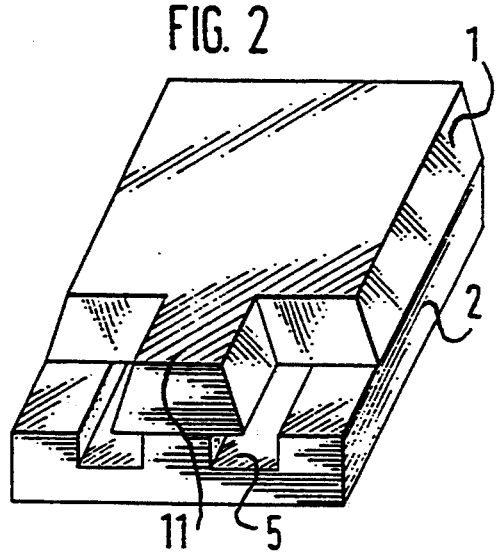
FIG. 2 illustrates a silicon plate treated underneath the silicon plate.

FIG. 2 illustrates two silicon plates 1, 2, a trapezoidal bond base 11 and trenches 5 located thereunder. The illustration of the bonding wires was omitted. Again, the trapezoidal bond base 11 was produced by employing the anisotropic etching process in 100-oriented silicon. Etching was performed from the top of the silicon plate 1. This bond base 11 is connected by the longer one of its parallel sides with the silicon plate 2. However, trenches 5 have been cut into the silicon plate 2, which reduce the contact surfaces between the bond base 11 and the silicon plate 2. Because of this step, the stray capacitance between the silicon plates 1 and 2 caused by the bond base 11 is kept small. A plurality of etching processes are usable for producing the trenches 5. In addition to anisotropic base etching solutions, it is possible to use plasma etching processes, such as reactive ion etching. The depth of the trenches 5 in this case depends on the thickness of a possible dielectric intermediate layer between the silicon plates 1 and 2. The depth of the trenches 5 should be greater than the thickness of a dielectric layer between the silicon plate 1 and the silicon plate 2. In case of direct silicon bonding by means of a chemically oxidized surface, the dielectric layer between the silicon plates 1 and 2 is of an order of magnitude of some 10 nm, therefore the trenches 5 need only be some μm deep in this case to reduce the stray capacitance noticeably. The front face was again produced by sawing of a larger silicon wafer sandwich.

Figure 3:
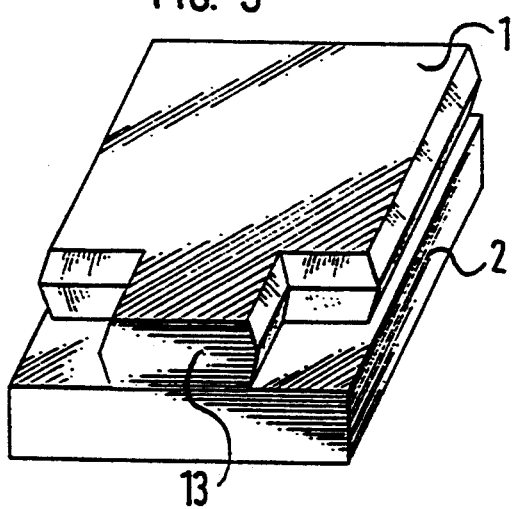
FIG. 3 illustrates a bond base of hexagonal cross section.

Two silicon plates 1, 2 and a bond base 13 are illustrated in FIG. 3. The bond base 13 has a hexagonal cross section, where the respectively oppositely located sides are parallel to each other. This bond base 13 was produced by two-sided etching of a 100-oriented silicon wafer. In the example shown here, the bonding surface created here is exactly as large as the contact surface between the bond base 13 and the silicon plate 2. Thus, this exemplary embodiment does not improve the ratio of the bond surface to the contact surface. Advantages here are that the stray capacitance is exactly defined and that an etching process can be used on both sides of the silicon plate.

Figure 4:
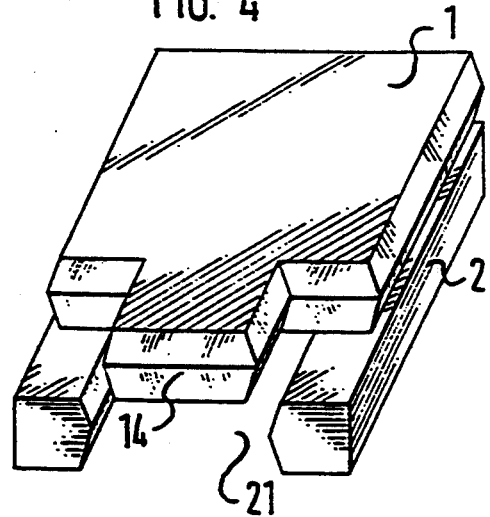
FIG. 4 illustrates a recess underneath the bond base.

Two silicon plates 1, 2 are illustrated in FIG. 4, where the silicon plate 1 has a bond base 14 and the silicon plate 2 includes a recess 21. The bond base 14 was again produced by two-sided etching of the silicon plate 1. In contrast to the bond base 13 of FIG. 3, in the bond base 14 shown here the front face was also exactly defined by an etching process. Because of the recess 21, the stray capacitance between the silicon plate 1 and the silicon plate 2 generated by the bond base 14 was reduced to near zero. A prerequisite for using the recess 21 is that the forces generated during bonding of the bonding wires to the bond bases do not destroy the bond bases. If the silicon plate I has the customary thickness of some hundred micrometers, the bond bases can tolerate the forces occurring during bonding. The production of the recess 21 was performed in FIG. 4 by using a two-sided etching process in 100-oriented silicon. It is also possible in an equivalent manner to use other, one-sided etching processes.

A capacitive acceleration sensor is illustrated in FIG. 5, constructed of a top plate 1, a center plate 2 and a bottom plate 3 of monocrystalline silicon. The movable electrode 22, consisting of a resilient bar 31 and a seismic mass 32, has been structured out of the center plate 2. The top plate 1 has a bond base 12 and the center plate 2 has a center plate bond base 15 for contact. The bond base 12 of the top plate 1 is connected with the bottom plate 3 via a support 23. The top plate i is only partially shown in the area of the movable electrode 22 in order to permit a view into the sensor. Thin, insulating films are placed between each of the individual silicon plates. Insulation between the various sensor parts is assured in this way. A metallized layer 30 has been applied to the bond base 12, the bond base 15 and the bottom plate 3, which permits bonding of the bonding wires 4 to the silicon surfaces. The bonding wires to the bond bases 12 and 15 have been omitted for reasons of a clearer view.

The movable electrode 22 is deflected from its position of rest by the application of acceleration. The capacitance measured between the plates is changed because of the small distance of the seismic mass 32 from the top plate 1 or the bottom plate 3. The capacitance change represents a measurement for the acceleration applied. The accuracy of measurement of the capacitance change is limited by the stray capacitance connected parallel to the measuring capacitance. The stray capacitance is reduced by the design in accordance with the invention of the bond bases and the sensitivity of the sensor improved in this way.

The center plate bond base 12 has a trapezoidal cross section. Producing such a cross section was described by way of example in connection with FIGS. 1 or 2. The support 23 is used to support the bond base 12 mechanically during the bonding process. The support 23 has no electrical contact with the remainder of the central plate 2. If the distance between the support 23 and the rest of the center plate 2 is sufficiently great, capacitive transfer from the bond base 12 to the center plate 2 is almost entirely suppressed. The bond base 15 has a nearly trapezoidal cross section and was produced by two-sided etching of the center plate 2. In this case only the etching processes required anyway for producing the movable electrode 22 were used. The cross sections of the bond base 15 produced in the course of this are described in detail in FIG. 6. The metallized layer 30 is produced by evaporation deposition of aluminum, for example. A shadow mask is used to provide a strip-shaped area of the sensor with the metallized layer 30.

Figure 6A:
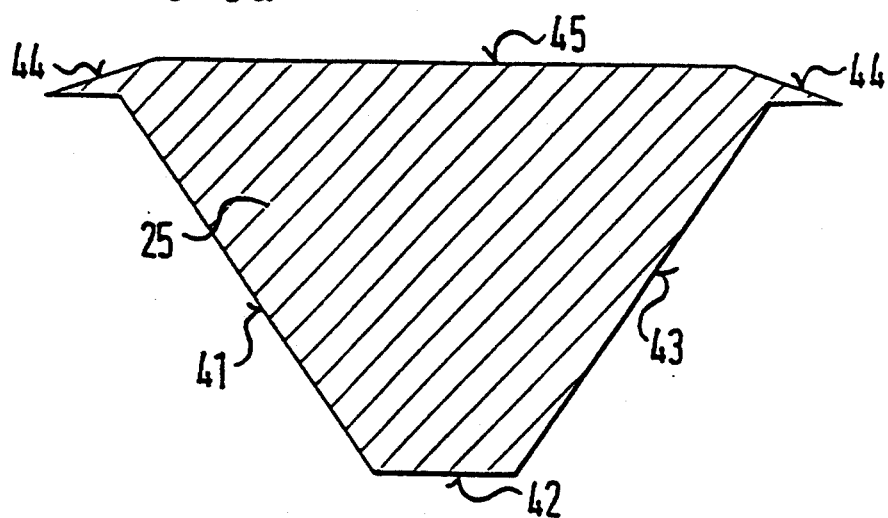
Figure 6B:
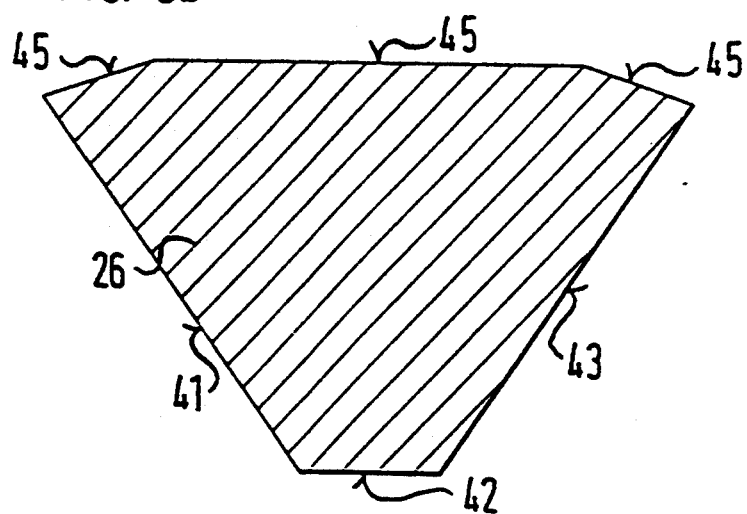
Figure 6C:
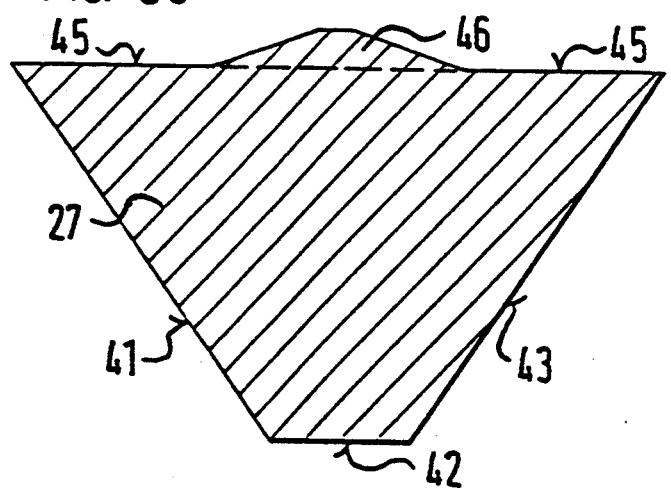

Various possible cross sections of the bond base 15 are illustrated in FIG. 6. The bond base 15 is produced by two-sided etching of the center plate 2. Since only the etching processes for producing the movable electrode are employed here, the cross-section can depend on the manufacturing process of the movable sensor part. Three possible cross sections of the bond base 15 are illustrated in FIG. 6, which define the term "nearly trapezoidal". A nearly trapezoidal bond base 15 with two points 44 is shown in FIG. 6a by 25. This cross section is nearly trapezoidal in that the top 45 is parallel to the bottom 42 and there are two inclined walls 41 and 43 having a relative angle of 70.5° with respect to each other. In this way this cross section is nearly similar to the trapezoidal cross section of the bond base 10 shown in FIG. 1. FIG. 6b is quite similar. Numeral 26 designates a bond base in which the top 45 is parallel to the bottom 42, the side walls 41 and 43 have an angle of 70.5°. The sides 45, not a part of the trapezoid, are relatively short and are at only a small angle with to the top 45. This structure is therefore called nearly trapezoidal. The design in accordance with FIG. 6c is trapezoidal in that a large portion of its surface can be covered by a trapezoid 27 with the sides 41, 42 and 43. The only difference with respect to the geometric shape of a trapezoid is the comparatively small hump 46. Which one of these three possible cross sections of the bond base 15 is achieved by means of the etching process depends on how the process for making the movable sensor part 22 is performed. The cross sections shown in FIG. 6a and FIG. 6b are preferred for bonding.

Various changes and modifications may be made, and features described in connection with any one of the embodiments may be used with any of the others, within the scope of the inventive concept.

We claim:

1. A capacitive sensor having
   at least two conductive, monocrystalline silicon plates (1, 2, 3) placed on top of each other, and insulated from each other;
   a movable electrode (22) structured out of at least one of said silicon plates which, together with at least another silicon plate, forms a plate capacitor;
   at least one bonding wire (4) electrically connected to at least one of said silicon plates, and comprising
   a wire bonding base (10–15) formed on portions of at least one of the silicon plates for electrically connecting said bonding wire to the respective silicon plate;
   said wire bonding base (10–15) being etched out from the respective silicon plate; and
   wherein a contact surface between the wire bonding base and one of said of the silicon plates which is located thereunder is defined by an etched region of said wire bonding base and one of said silicon plates located thereunder.

2. The sensor of claim 1, wherein the surface of the wire bonding base (10) for applying the bonding wire (4) is larger than the contact surface between the bonding base and the at least one of the silicon plates thereunder.

3. The sensor of claim 1, wherein the wire bonding base (10, 15) of at least one of the silicon plates projects from the respective plate, and has a trapezoidal cross section transverse to the direction of projection.

4. The sensor of claim 3, wherein the wire bonding base (10) having the shorter of the parallel sides of the trapezoid of the trapezoidal cross section is connected with a further one of the silicon plates.

5. The sensor of claim 1, wherein the wire bonding base (13, 14) of at least one of the silicon plates projects from the respective plate, and has a hexagonal cross section transverse to the direction of projection.

6. The sensor of claims 1, wherein that at least one of the silicon plates which is located underneath the wire bonding base (15) is etched in an area located underneath the wire bonding base.

7. The sensor of claim 1, wherein that at least one of the silicon plates which is located immediately beneath the wire bonding base (14) is formed with a recess (21) in the area located underneath the wire bonding base.

8. The sensor of claim 1, wherein three silicon plates (1, 2, 3) are provided defining, respectively, a top plate (1), a center plate (2) and a bottom plate (3); and
   wherein the movable electrode is structured out of the center plate (2).

9. The sensor of claim 8, wherein a first wire bonding base (12) is formed on the top plate (1); and
   a support structure (13) is formed on the center plate, connected to said bonding base formed on the top plate (1) and to the bottom plate (3).

10. The sensor of claim 9, wherein said support structure has essentially hexagonal cross section.

11. The sensor of claim 9, wherein said support structure is an etched structure obtained by etching the center plate (2) from both sides thereof.

12. The sensor of claim 8, wherein the center plate (2) includes a center wire bonding base (15), said center wire bonding base projecting from said center plate and being of, essentially, trapezoidal cross section transverse to the direction of projection; and
   wherein the distance between the parallel sides of the essentially trapezoidal center wire bonding base corresponds approximately to half the thickness of the center plate.

13. The sensor of claim 8, wherein the center plate (2) is formed with a center wire bonding base (15) projecting from the center plate; and
   said center wire bonding base (15) comprising an etched structure obtained by etching the center plate (2) from both sides thereof.

* * * * *